United States Patent

Ichihara

[11] Patent Number: 5,814,532
[45] Date of Patent: Sep. 29, 1998

[54] METHOD OF MANUFACTURING SEMICONDUCTOR LASER

[75] Inventor: Jun Ichihara, Kyoto, Japan

[73] Assignee: Rohm Co., Ltd., Kyoto, Japan

[21] Appl. No.: 848,677

[22] Filed: Apr. 29, 1997

[30] Foreign Application Priority Data

Apr. 30, 1996 [JP] Japan .................................. 8-109197

[51] Int. Cl.⁶ .................................................. H01L 21/00
[52] U.S. Cl. .............................. 438/33; 438/42; 438/44; 438/68; 438/460; 438/462
[58] Field of Search .................. 438/33, 42, 68, 438/460, 44, 462, 289, 292, 293, 386; 148/DIG. 28, DIG. 95

[56] References Cited

U.S. PATENT DOCUMENTS

| | | | |
|---|---|---|---|
| 4,788,161 | 11/1988 | Goto et al. | 438/33 |
| 4,865,684 | 9/1989 | Bouadma | 156/643 |
| 5,180,685 | 1/1993 | Yamamoto et al. | 437/129 |
| 5,629,233 | 5/1997 | Chand et al. | 438/33 |

*Primary Examiner*—John Niebling
*Assistant Examiner*—Long Pham
*Attorney, Agent, or Firm*—Nikaido, Marmelstein, Murray & Oram LLP

[57] ABSTRACT

Disclosed is a method of manufacturing a semiconductor laser. A wafer having a substrate having a semiconductor layer including a light-emitting forming portion epitaxially grown on a surface of the substrate is broken into laser chips having a light-emitting surface at an end face thereof. When breaking the wafer into the chips, the breaking at the light-emitting surface is carried out by first forming street grooves in the substrate and thereafter cleaving the light-emitting layer forming portion. By doing so, there is no necessity of thinning the substrate to a required extent, facilitating handling during the manufacture process. A roughened surface of the street groove is provided in the substrate underlying the light-emitting layer forming portion, which is convenient for irregular reflection of a return light beam often encountered in an optical disc pickup device.

6 Claims, 3 Drawing Sheets

METHOD OF MANUFACTURING SEMICONDUCTOR LASER

BACKGROUND OF THE INVENTION

This invention relates to a method of manufacturing a semiconductor laser which is adapted to radiate a beam of laser light through an chip end face thereof. More particularly, this invention is concerned with a method of manufacturing a semiconductor laser, which is easy to handle during the manufacturing process without necessity of thinning the substrate thereof, preventing adverse effect due to return light beams often encountered in pickup devices for optical discs.

The semiconductor laser is generally structured as shown in FIG. 4(a) wherein a chip thereof is exemplified by the perspective view. That is, the semiconductor laser includes a GaAs substrate 10. On the GaAs substrate 10, a buffer layer 11 and a light-emitting layer 15 are epitaxially grown of an AlGaAs-base semiconductor material (which means a material hereinafter expressed by $Al_xGa_{1-x}As$, where the Al ratio x of mixture crystal is selectable between 0 and 1). On these layers is further provided a semiconductor layer 16 having a current-restricting layer formed, as the type may be, with a stripe groove 19. Respective electrodes 17, 18 are provided on the opposite surfaces so that electric current supplied between the electrodes 17, 18 is allowed to concentrate to the light-emitting layer at a portion defined by the width of the stripe groove 19. The light-emitting layer 15 is usually of a double-hetero structure, which has a non-doped active layer sandwiched between n-type and p-type clad layers wherein the chemical composition is different between the active layer and the clad layer so as to confine carriers and light created in the active layer. As a consequence, the electric current is allowed to concentrate in the light-emitting layer immediately below the stripe groove 19 to create light. The light thus created is confined in the active layer at the width of the stripe groove 19 to oscillate therewithin, thereby being emitted as an oscillation light S through a stripe portion of the chip end face. Although the emission takes place simultaneously through the opposite end face, which is omitted in the figure.

The semiconductor laser chip as stated is manufactured by cleaving a wafer 1 having the epitaxially-grown semiconductor layer and electrodes formed thereon, as shown in FIG. 4(b). In order to cleave the wafer 1, cut-outs 22 are formed by a diamond cutter at peripheral ends of the wafer to cause cleavage along the line 22 in the direction perpendicular to the stripe line 19. Meanwhile, the dividing along the line 23, i.e., in a direction parallel with the stripe groove 19, is carried out by cleaving or sawing. The light-emitting surface of the semiconductor laser, if finished not in a mirror-like state, causes light to reflect in various directions without laser oscillation and does not serve as an oscillator for light. Consequently, to obtain a mirror-like light-emitting surface, cleaving is done to obtain a light-emitting end face perpendicular to the stripe groove. The cleavage is carried out to break a semiconductor crystal along a crystalline plane thereof, so that the semiconductor crystal, if relatively thick but epitaxially grown in similar lattice constant crystalline layer, is easy to break. But in order to obtain positive breaking, there is necessity of thinning the crystal down to 100 μm or less.

In the meanwhile, where a semiconductor laser is utilized as a pickup device for optical discs, there is a possibility that a return beam reflected by the optical disc comes back close to the light-emitting surface. Such return light may reflected at the mirror surface of the light-emitting surface and travels back to the optical disc side, turning into noises. For suppressing noises due to return beams, devising has been made by providing an optical system with a convex lens at the front of a semiconductor laser so as to avoid return beams from coming back to the vicinity of the light-emitting surface. With such method, however, it is impossible to let the return beam be distant 70 to 120 μm or greater from the center of the light-emitting layer. To this end, the semiconductor substrate is thinned down to 70 μm or less and a slant surface is provided to a silicon submount on which the semiconductor laser chip is mounted, such that a return beam if comes back is reflected toward the direction other than the objective optical disc, preventing entrance again to the optical disc.

As stated above, the conventional semiconductor laser is thinned of the substrate down to 70 μm or less during the manufacturing process in order to obtain positive cleavage or cope with return beams during usage. This, however, raises a problem that the wafer is apt to be fractured upon handling in the wafer treating process.

Furthermore, where a silicon substrate having a different chemical composition from that of GaAs is employed, for the purpose of reducing wafer cost, to epitaxially grow a semiconductor layer thereon for the manufacture of a semiconductor laser, there encounters great difference in lattice constant between the substrate and the epitaxially grown semiconductor layer, making difficult to obtain a perfect cleavage surface. Furthermore, where a sapphire substrate ($Al_2O_3$ single crystal) is utilized to form a GaN-base semiconductor layer to manufacture a blue-color semiconductor laser, there is a problem that it is impossible to cleave the C-plane sapphire substrate along a plane perpendicular to the wafer surface.

SUMMARY OF THE INVENTION

The present invention has been made to solve these problems, and it is an object of the present invention to provide a method of manufacturing a semiconductor laser which is easy to handle during the manufacturing process and free from incurring the problem in cleavage and the problem of return light beams in such applications as optical discs.

It is another object of the present invention to provide a method of manufacturing a semiconductor laser, which is capable of providing a mirror-like cleaved surface to the light-emitting surface even where a light-emitting layer is formed on a substrate of a material (the material involves those that is impossible to be cleaved) different in cleavage characteristic from the light-emitting layer of the semiconductor layer.

The method of manufacturing a semiconductor laser according to the present invention comprising the steps of: (a) epitaxially growing a semiconductor layer including a light-emitting layer forming portion on a surface of a substrate in a wafer form; (b) forming street grooves in the substrate along a chip end face forming portion for a light-emitting surface; and (c) cleaving the chip end face forming portion of the semiconductor layer epitaxially grown.

Here, the street groove means a groove mechanically formed through sawing by a blade or a laser beam or chemically formed through dry etching, etc. also, the light-emitting layer forming portion means an overlying structure having an active layer sandwiched between an n-type clad layer and a p-type clad layer or a junction structure including an n-type layer and a p-type layer.

Preferably, the street groove is formed in the substrate so that the street groove has a depth distant 50 μm or less from the center of the light-emitting layer, for the purpose of positive cleavage. In such a case, even where the street groove is formed through the entire thickness of the substrate down to the semiconductor layer including a buffer layer, etc., there is no problem if the groove does not reach the light-emitting layer forming portion.

For example, the substrate may be formed of GaAs and the light-emitting layer forming portion is formed of a AlGaAs-base semiconductor. Also, where the substrate is of a material different in a cleavage characteristic from the light-emitting layer forming portion of the semiconductor layer, the effect is particularly available because according to the present invention the substrate is divided by mechanical cutting and a mirror-like cleaved surface is provided for a laser chip end face as a light-emitting surface at the epitaxially-grown semiconductor layer.

Here, the materials of different cleavage characteristic refer to the combination of materials which cannot be cleaved in the same plane, e.g., the combination of such materials largely different in lattice constant as silicon (Si) and GaAs semiconductor layers, or the combination of such materials difficult to cleave as a sapphire substrate and a GaN(gallium nitride)-base compound semiconductor layer. In such a case, the street groove is preferably formed to have a depth of 20 $\mu$m or less from the center of the light-emitting layer.

Here, the gallium-nitride-base compound semiconductor refers to a semiconductor comprising a compound of a group-III element Ga and a group-V element N or a compound of a group-III element Ga part of which is replaced by another group-III element such as Al and In and/or a compound of group-V element N part of which is replaced by another group-V element such as P and As.

DETAILED DESCRIPTION

The method of manufacturing a semiconductor laser according to the present invention will now be described with reference to the drawings.

Figure 1:
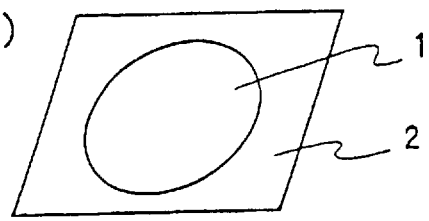
FIGS. 1(*a*) to 1(*d*) are an explanatory view for a method of manufacturing a semiconductor laser of the present invention showing a manufacturing process of dividing a wafer into chips.
Figure 1:
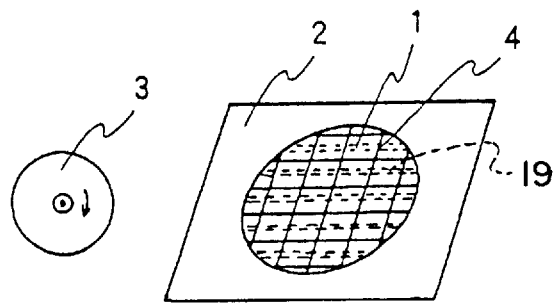
Figure 1:
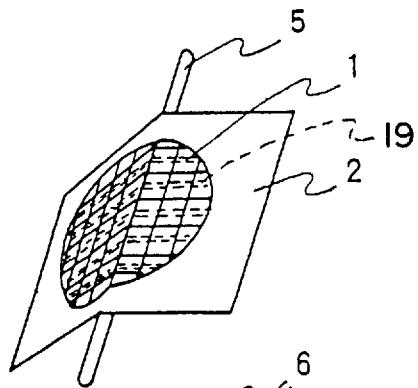
Figure 1:
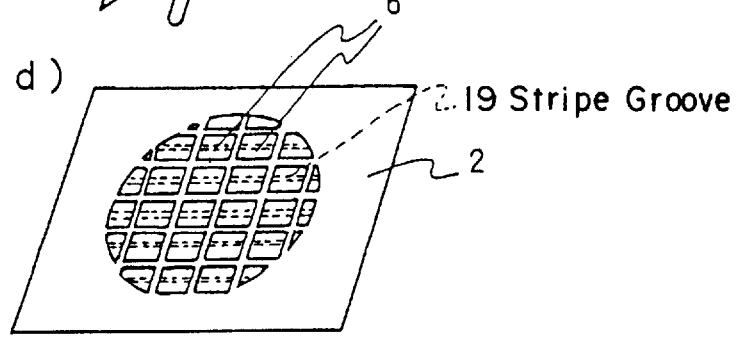

There are illustrated in FIGS. 1(*a*) to 1(*d*) explanatory views showing the process for manufacturing a semiconductor laser of the invention, wherein a wafer 1 comprises a wafer substrate formed of GaAs and a semiconductor layer epitaxially grown on the substrate. To divide the wafer 1 into individual chips, the wafer 1 is first adhesive-mounted on an expansible dicing tape 2. Then street grooves 4 are formed in the wafer substrate along chip end face forming portions. Thereafter, the chip end face forming portions of the epitaxially-grown semiconductor layer is cleaved to obtain individual chips 6. The process will be explained in more detail below.

Referring to FIG. 1(*a*), the wafer 1 after completing required processing is adhesive-mounted onto an expansible dicing tape 2 with an GaAs substrate thereof positioned upward.

Figure 2:
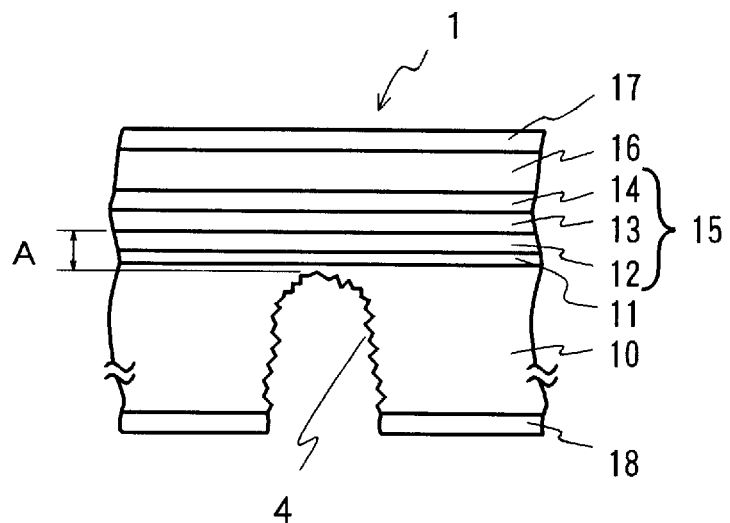
FIG. 2 is an explanatory view showing a state that street grooves are formed in the wafer according to the method of the present invention.
Figure 3:
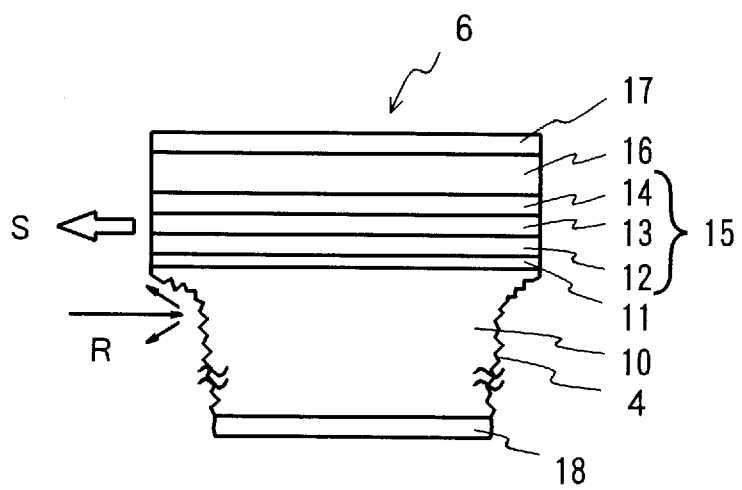
FIG. 3 is a sectional explanatory view of a chip divided by the method of the present invention.
Figure 4:
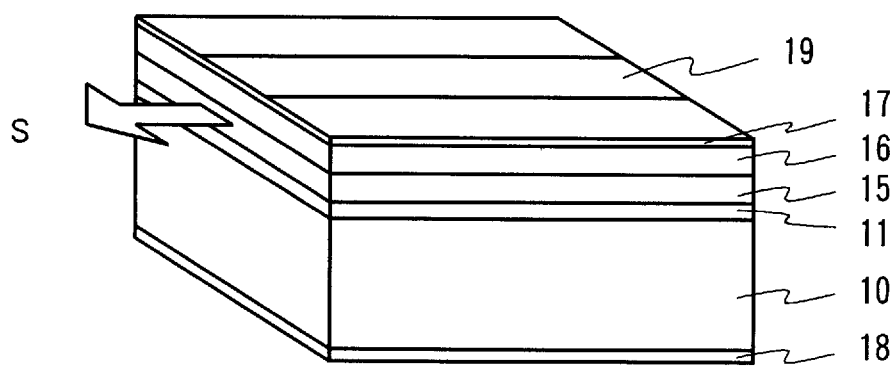
FIGS. 4(*a*) to 4(*b*) are a squint explanatory view of a semiconductor laser chip and a diagram for explaining the conventional method.
Figure 4:
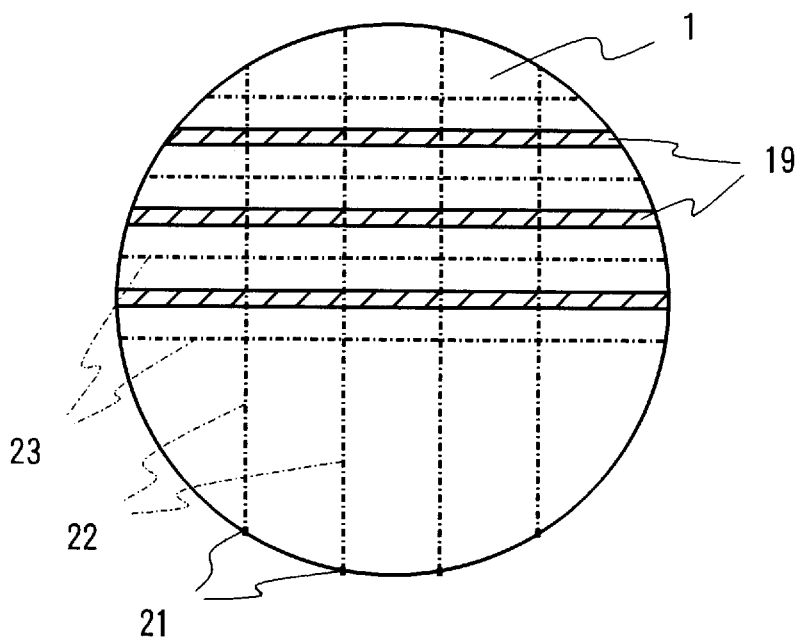

Then street grooves 4 are formed in the wafer through sawing by a dicing wheel (diamond blade wheel) 3, as shown in FIG. 1(*b*). These street grooves 4 are provided in a lattice form such that they extend both in a direction parallel with stripe grooves 19 (not shown in FIGS. 2 to 3) and a direction perpendicular to the stripe groove 19. Among them, the street grooves 4 perpendicular to the stripe groove 19 are in a plane for a light-emitting surface of an individual semiconductor laser chip, so that they are formed to a depth of approximately 50 $\mu$m above a center of a light-emitting layer forming portion 15 (see A in FIG. 2). On the other hand, the street grooves 4 in parallel with the stripe groove 19 are not in a plane of light-emitting surface, so that they are usually formed extending through the semiconductor layer without requiring separate cleavage.

Then, as shown in FIG. 1(*c*), the wafer 1 is bent together with the expansible tape 2 by using for example a rod 5 to cause cleavage along the perpendicular street groove 4 to the stripe groove 19. Thereafter, the wafer 1 is further cleaved by bending along the street groove parallel with the stripe groove 19, thereby breaking the wafer completely into individual chips. In this case, after forming the street grooves 4 in the lattice form as above, street grooves may be additionally formed in the back surface of the substrate perpendicular to the stripe groove 19 correspondingly in the main surface, i.e., in the semiconductor layer. That is, an expansible tape is newly adhered to the opposite surface of the substrate and then the expansible tape 2 first adhered is removed from the surface of the semiconductor layer so as to provide additional cutting at peripheral end of the wafer, and to be cleaved as stated above. With such process, the cleavage is more positive to perform.

Thereafter, as shown in FIG. 1(*d*), the expandible tape 2 is stretched to separate the wafer completely into individual chips due to the street grooves 4 and the cleavage caused thereby. The chips thus separated on the expandible tape 2 are picked up by a vacuum collet or the like to be transported onto a silicon sub-mount or the like for being die-bonded for assembling.

Although the process of growing the semiconductor layer including the light-emitting layer forming portion 15 is not shown, the semiconductor layer is formed in a usual way and method. For example, FIG. 2 and FIG. 3 respectively illustrates an explanatory sectional view for dividing the wafer and an explanatory sectional view of a chip portion. In the figures, a substrate 10 is formed of n-type GaAs having a thickness of approximately 300 to 350 $\mu$m. On the GaAs substrate 10, a light-emitting layer forming portion 15 is formed by epitaxially growing in order an n-type buffer layer 11 of an AlGaAs-base semiconductor having a layer thickness of approximately 0.2 $\mu$m, an n-type clad layer 12 of an AlGaAs-base semiconductor having a layer thickness of approximately 2 $\mu$m, a non-doped active layer 13 of an AlGaAs-base semiconductor having a layer thickness of approximately 0.1 $\mu$m, and a p-type clad layer 14 of an AlGaAs-base semiconductor having a layer thickness of approximately 2 $\mu$m. Furthermore, on the light-emitting layer forming portion 15 is formed an overlaid semiconductor layer 16 by epitaxially growing various semiconductor layers including a current-restriction layer of n-type GaAs having a stripe groove formed therein and a p-type contact layer. Electrodes 17, 18 are respectively formed on the p-type semiconductor layer and n-type substrate in electrical connection therewith. The light-emitting layer forming portion 15 is of a doublehetero structure by selecting materials ($Al_xGa_{1-x}$ As, wherein the ratio x for the mixture crystal is varied) for the both clad layers 12, 14 and the active layer 13 in consideration of band-gap energy so as to confine carriers and light within the active layer 13.

According to the semiconductor laser chip 6 manufactured by the method of the present invention, the eitaxially-grown semiconductor layers 15, 16 are broken by cleavage into a mirror-like surface. In this case, the vertical center of the light-emitting the layer 15 and the street groove 4 in the GaAs substrate 11 are provided distant by approximately 50 μm or greater, wherein the street groove 4 is formed by sawing or etching into a roughened surface. As a result, where a semiconductor laser using the chip 6 is employed for an optical disc pickup device, a laser light beam S oscillated in the light-emitting layer forming portion 15 travels through a mirror-like end face in a direction perpendicular thereto. The return beam R reflected by an optical disc will impinge on the street groove 4 (the impinging point can be varied by approximately 70 μm distant from an radiating point by using an optical system with a convex lens, etc.), where the beam is irregularly reflected by the roughened surface of the street groove 4 without being turned into noises.

Although in the above example the light-emitting layer of the AlGaAs-base semiconductor was epitaxially grown on the GaAs substrate, the present invention is similarly applicable to a case where a silicon (Si) substrate is used to epitaxially grow thereon an AlGaAs-base semiconductor light-emitting layer. That is, the lattice constant is largely different between the Si-base semiconductor material and the AlGaAs-base semiconductor material, and accordingly the AlGaAs-base semiconductor is difficult to cleave together with the substrate of Si. According to the present invention, however, the semiconductor layer epitaxially grown on the substrate, after street grooves are formed in the substrate, is subjected to cleavage, thereby providing a semiconductor laser chip with a fine and mirror-like light-emitting surface. In also this case, it is possible to let a return beam impinge on a point in the street groove so as to cause the return beam for irregular reflection. Incidentally, the AlGaAs semiconductor layer and the Si substrate are difficult to cleave in a continuous plane, so that it is preferred that the depth of the street groove is determined 20 μm or less from the center of the light-emitting layer (see A in FIG. 2).

On the other hand, where sapphire substrate is used to epitaxially grow a GaN-base or InGaN-base semiconductor layer to provide a blue-color semiconductor laser or the like, a sapphire substrate of a C-plane is difficult to cleave in a direction perpendicular to the surface thereof. With such substrate, a mirror-like light-emitting surface of a semiconductor layer is unavailable for a blue-color laser device. In the method of the present invention, however, street grooves are first formed in a sapphire substrate by sawing (or etching) and the epitaxially grown semiconductor layer is then subjected to cleavage. Therefore, a mirror-like light-emitting surface is provided in a chip even for a blue-color semiconductor laser device. Incidentally, since the sapphire substrate is hard to break, there is necessity of providing street grooves comparatively deep in depth, preferably 20 μm or less from the center of the light emitting layer (see A in FIG. 2). In such a case, even if the street groove is formed through the sapphire substrate to such a depth as to reach an epitaxially-grown semiconductor layer, e.g., the buffer layer, there practically is no problem if it does not reach the light-emitting layer.

As explained above, where manufacturing a semiconductor laser device having a light-emitting layer in a semiconductor layer formed on a substrate, street grooves are first formed by sawing (or etching) in the substrate and then cleavage is made for the light-emitting layer of the semiconductor layer. Consequently, there is no necessity of thinning the substrate, facilitating handling of the wafer during the manufacture process and hence improving the operational efficiency. Therefore, the process steps are decreased and the manufacture yield is increased, contributing to reduction of manufacturing cost.

Furthermore, since the street groove is formed by sawing or etching in the greater portion of the substrate, the cut surface of the substrate is not mirror like but a roughened surface. To this end, even where a return beam is incident on the semiconductor laser device during usage of the semiconductor laser device, the return beam if comes back impinges on the roughened surface to be irregularly reflected or scattered without being turned into noises.

Furthermore, even where using a substrate having a different cleavage characteristic from that of a semiconductor layer to be grown thereon, a mirror-like light-emitting surface is available by such a simple process that street grooves are first cut in the substrate and then the semiconductor layer involving the light-emitting layer is subjected to cleavage.

Although preferred embodiments have been described in some detail, it is to be understood that certain changes can be made by those skilled in the art without departing from the spirit and scope of the invention as defined by the appended claims.

What is claimed is:

1. A method of manufacturing a semiconductor laser device, comprising the steps of:

(a) forming, on a substrate, a light emitting layer forming portion of an overlying structure having a first conductivity type cladding layer, an active layer and a second conductivity type cladding layer;

(b) growing a first conductivity type semiconductor layer on said second conductivity type cladding layer of said light emitting layer forming portion, and forming a stripe groove by etching said first conductivity type semiconductor layer to therein provide a current-restriction layer;

(c) forming a second conductivity type semiconductor layer on said current-restriction layer;

(d) forming street grooves in a lattice form in said substrate in directions parallel with and perpendicular to said stripe groove; and (e) cleaving at said light emitting layer forming portion along said street grooves which are perpendicular to said stripe groove to therein divide said substrate into chips.

2. The method of claim 1, wherein the street groove is formed in the substrate so that the street groove has a depth distant 50 μm or less from the center of said active layer.

3. The method of claim 1, wherein said substrate is formed of GaAs and said light-emitting layer forming portion is formed of a AlGaAs-base semiconductor.

4. The method of claim 1, wherein said substrate is of a material different in a cleavage characteristic from said light-emitting layer forming portion of said semiconductor layer.

5. The method of claim 1, wherein said substrate is of a silicon and said light-emitting layer forming portion is of an AlGaAs semiconductor, and wherein the street groove is formed to have a depth of 20 μm or less from the center of said active layer.

6. The method of claim 1, wherein said substrate is of sapphire and said light-emitting layer forming portion is of a gallium-nitride-based compound semiconductor, and wherein the street groove is formed to have a depth of 20 μm or less from the center of said active layer.

* * * * *